United States Patent
Farrar et al.

(10) Patent No.: US 6,958,287 B2
(45) Date of Patent: Oct. 25, 2005

(54) MICRO C-4 SEMICONDUCTOR DIE

(75) Inventors: Paul A. Farrar, South Burlington, VT (US); Jerome Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/396,558

(22) Filed: Mar. 26, 2003

(65) Prior Publication Data

US 2003/0186485 A1 Oct. 2, 2003

Related U.S. Application Data

(60) Division of application No. 09/773,522, filed on Feb. 2, 2001, which is a continuation-in-part of application No. 09/546,084, filed on Apr. 10, 2000, now Pat. No. 6,435,396.

(51) Int. Cl.[7] .............................................. H01L 21/44
(52) U.S. Cl. ....................... 438/613; 438/614; 438/615; 438/617; 438/667
(58) Field of Search ................................. 438/613–617, 438/663–669, 612, 586, 694

(56) References Cited

U.S. PATENT DOCUMENTS

| | | | |
|---|---|---|---|
| 3,959,047 A | | 5/1976 | Alberts et al. |
| 4,532,002 A | | 7/1985 | White |
| 4,532,530 A | | 7/1985 | Hawkins |
| 4,606,998 A | | 8/1986 | Clodgo et al. |
| 4,828,886 A | | 5/1989 | Heiber |
| 5,229,016 A | | 7/1993 | Hayes et al. |
| 5,240,878 A | | 8/1993 | Fitzsimmons et al. |
| 5,377,902 A | * | 1/1995 | Hayes ......................... 228/254 |
| 5,457,345 A | | 10/1995 | Cook et al. |
| 5,461,257 A | | 10/1995 | Hundt |
| 5,492,235 A | * | 2/1996 | Crafts et al. ................. 438/695 |

(Continued)

FOREIGN PATENT DOCUMENTS

JP        408236938        9/1996

OTHER PUBLICATIONS

*Solder Transfer Technique for Flip–Chip and Electronic Assembly Applications, Karl J. Puttiitz, et al., IEEE Transactions on Components, Packaging and Manufacturing Technology, Part C, vol. 21, No. 3, Jul., 1998.

(Continued)

*Primary Examiner*—Michael Lebentritt
(74) *Attorney, Agent, or Firm*—Dickstein Shapiro Morin & Oshinsky LLP

(57) ABSTRACT

A semiconductor die having multiple solder bumps, each having a diameter less than about 100 microns, and the method for making such a die are described. The solder bumps are preferably about 10 microns in diameter, and the pitch between the solder bumps is less than 100 microns, and preferably less than or equal to 10 microns. A thermal solder jet apparatus is utilized to deposit solder material to form the solder bumps. The apparatus includes a print head having a plurality of solder ejection ports. Each ejection port has an associated gas ejection conduit connected to a chamber containing one or more hydride films. The hydride film is heated to disassociate hydrogen gas. The hydrogen gas rapidly builds up in the conduit which leads to the ejection port which is loaded with a solder material and forces the ejection of the solder material from the port. A controller controls and choreographs the movements of the movable substrate and movable drive so as to accurately deposit material in desired locations on the semiconductor dies.

11 Claims, 8 Drawing Sheets

U.S. PATENT DOCUMENTS

| | | | | |
|---|---|---|---|---|
| 5,629,838 A | * | 5/1997 | Knight et al. | 361/782 |
| 5,642,261 A | | 6/1997 | Bond et al. | |
| 5,667,132 A | | 9/1997 | Chirovsky et al. | |
| 5,678,301 A | | 10/1997 | Gochnour et al. | |
| 5,681,757 A | * | 10/1997 | Hayes | 257/778 |
| 5,691,239 A | | 11/1997 | Hakey et al. | |
| 5,693,572 A | | 12/1997 | Bond et al. | |
| 5,762,259 A | | 6/1998 | Hubacher et al. | |
| 5,779,791 A | | 7/1998 | Pan et al. | |
| 5,786,270 A | | 7/1998 | Gorrell et al. | |
| 5,808,360 A | | 9/1998 | Akram | |
| 5,838,069 A | | 11/1998 | Itai et al. | |
| 5,866,475 A | | 2/1999 | Yanagida | |
| 5,876,615 A | | 3/1999 | Predetechensky | |
| 5,888,884 A | | 3/1999 | Wojnarowski | |
| 5,903,058 A | | 5/1999 | Akram | |
| 5,925,931 A | | 7/1999 | Yamamoto | |
| 5,937,320 A | * | 8/1999 | Andricacos et al. | 438/614 |
| 5,946,590 A | * | 8/1999 | Satoh | 438/613 |
| 5,969,424 A | * | 10/1999 | Matsuki et al. | 257/768 |
| 6,000,597 A | | 12/1999 | Straub et al. | |
| 6,074,895 A | | 6/2000 | Dery et al. | |
| 6,076,723 A | | 6/2000 | Pan | |
| 6,081,026 A | * | 6/2000 | Wang et al. | 257/700 |
| 6,097,087 A | | 8/2000 | Farnworth et al. | |
| 6,114,187 A | | 9/2000 | Hayes | |
| 6,117,299 A | | 9/2000 | Rinne et al. | |
| 6,122,177 A | | 9/2000 | Kitano et al. | |
| 6,133,634 A | | 10/2000 | Joshi | |
| 6,136,689 A | * | 10/2000 | Farrar | 438/626 |
| 6,162,652 A | * | 12/2000 | Dass et al. | 438/18 |
| 6,198,443 B1 | | 3/2001 | DiGiacomo | |
| 6,249,347 B1 | | 6/2001 | Svetkoff et al. | |
| 6,268,662 B1 | * | 7/2001 | Test et al. | 257/784 |
| 6,300,234 B1 | * | 10/2001 | Flynn et al. | 438/612 |
| 6,329,605 B1 | * | 12/2001 | Beroz et al. | 174/256 |
| 6,501,663 B1 | | 12/2002 | Pan | |
| 6,521,530 B2 | * | 2/2003 | Peters et al. | 438/667 |
| 6,537,854 B1 | * | 3/2003 | Chang et al. | 438/118 |
| 6,583,039 B2 | * | 6/2003 | Chen et al. | 438/612 |

OTHER PUBLICATIONS

*MicroJet Printing of Solder and Polymers for Multi–Chip Modules and Chip–Scale Packages, Donald J. Hayes et al., MicroFab Technologies, Inc., IMPAS '99.

*Self–Aligned Controlled Collapse Chip Connect (SAC4), L. Pfeiffer et al., J. Electrochem. Soc.: Solid–State Science and Technology, Nov. 1987.

*Review of Flip Chip Bonding, Vincent C. Marcotte, et al., IBM East Fishkill Facility, no date.

*Solder Jet Printing of Micropads and Vertical Interconnects, David B. Wallace, et al., www.microfab.com/paper/smta97/smta97.htm, (Aug. 12, 2000).

*Combination Process for Final Metal Lines and Metal Terminals, Research Disclosure, No. 34232, Kenneth Mason Publications Ltd., England (Oct. 1992/753).

*Process for High Density of Chip Terminals on Large Wafers, Research Disclosure, 34625 Kenneth Mason Publications Ltd., England (Feb. 1993/97).

*Key Process Controls for Underfiling Flip Chips, Alec J. Babiarz et al., Solid State Technology, 1997 by PennWell Publishing Company.

*Mark's Standard Handbook for Mechanical Engineers, Tenth Edition, Eugene A. Avallone, et al, no date.

*Flow of gases through tubes and orifices, David G. Worden, Scientific Foundations of Vacuum Technique, Saul Dushman, no date.

*Sorption of gases by "active" charcoal, silicates (including glasses), and cellulose, "Scientific Foundations of Vacuum Technique", J. Wiley and Sons (1962).

*Electronic Materials Handbook, vol. 1, Packaging, pp. 301, 440, no date.

*Technology Challenges for Advanced Interconnects, James G. Ryan et al, Conference Proceedings ULSI XIII©1998 Materials Research Study.

Soller et al., "A Flexible Multi–Layer Resist System Using Low Temperature Plasma–Deposited Silicon Nitride," Journal of the Electrochemical Society, vol. 131, No. 4, pages 868–72, Apr. 1984.

* cited by examiner

MICRO C-4 SEMICONDUCTOR DIE

This is a divisional application of U.S. patent application Ser. No. 09/773,552, filed Feb. 2, 2001, which is a continuation-in-part of application Ser. No. 09/546,084 filed Apr. 10, 2000, now U.S. Pat. No. 6,435,396, issued Aug. 20, 2002, the disclosures of which are incorporated herein in their entirety by reference. This application is also related to U.S. patent application Ser. No. 10/396,571, filed Mar. 26, 2003, which is also a divisional application of U.S. patent application Ser. No. 09/773,522.

FIELD OF THE INVENTION

This invention relates generally to semiconductor dies and more particularly to forming connection sites on flip chip semiconductor dies.

BACKGROUND

The formation of connection sites on integrated circuits is well known. Conventional methods of forming connection sites are described, for example, in U.S. Pat. No. 6,117,299 (Rinne et al.) and U.S. Pat. No. 6,074,895 (Dery et al.).

With the growing complexity and increased numbers of transistors which can be placed on a single ULSI chip or die has come additional demands on the wiring and connection site processes. The number of internal metal layers required to interconnect the newer, more complex microprocessors has dramatically increased, as have the number of external connection sites. Due to the increased complexity, lower yield and added cost associated with the metallurgy, it is desirable to fabricate smaller semiconductor dies and place more wiring levels in the packaging. To accomplish this without degrading performance, a large number of exterior die connection sites are required.

One of the most efficient and compact ways for providing external die connection sites uses solder bumps in the so-called flip chip or C-4 (i.e., the Controlled Collapse Chip Connection) process. This technology eliminates the need to wire bond connections from the die bond pads to a packaging lead frame, and offers more connection sites, higher speeds, improved heat transfer, and can be used with smaller die sizes. Although C-4 technology is somewhat costly in terms of time, materials, and equipment, and although it presents certain environmental issues, the use of solder bumped integrated circuits is growing at a significant rate. At present, conventional large flip chip semiconductor dies may provide hundreds of connection sites.

The importance of this technology is underscored by the formation of the "MicroFab Consortium" (MicroFab) of private and governmental entities for the purpose of exploring and developing new methods for applying solder bumps and other materials to integrated circuit dies, optical circuits, hybrids, chip carriers and other devices. The literature suggests that MicroFab has successfully developed manufacturing prototypes of piezoelectrically actuated print heads for ejecting low-melting point solder balls of well-defined sizes at rates approaching several kilohertz (kHz). Although piezoelectric-based solder ball printers have several attractive characteristics, they are limited by the fact that piezoelectric device strength decreases rapidly with rising temperatures and vanishes at their Curie temperatures. The Curie temperatures of useful ceramics are well under 300° C. Thus, the ability to manipulate solder viscosity and surface tension by raising temperature is limited in such print heads. Other significant limitations to using piezoelectric-based print heads includes their complexity and the great difficulty in mass producing them in large, inexpensive, relatively light weight arrays.

Thus, a need exists for a method of forming a micro flip chip which contains a very high density of solder bumps, and to do so in a way which is not restricted by the Curie temperatures of the print head materials.

SUMMARY

The invention provides a flip chip semiconductor die which includes a substrate, a plurality of bond pads located on the substrate, and a plurality of solder bumps deposited on the bond pads. Each of the solder bumps is less than about 100 microns in diameter and the solder bumps are aligned in rows such that the pitch between solder bumps within the same row is less than about 100 microns. In a preferred embodiment, one or both of the solder bump diameter and pitch may be less than or equal to 10 microns.

The invention further provides a semiconductor device that includes a die having one or more a metallurgy layers positioned over a substrate, an insulating layer deposited on the uppermost metallurgy layer, and a plurality of exterior connection sites. A solder bump is deposited on each connection site and is less than about 100 microns in diameter, and may be less than or equal to 10 microns.

The invention also provides a system for depositing solder on a plurality of bond pads located on semiconductor dies. The system includes a movable substrate adapted to move at least one semiconductor die back and forth in a first plane, a movable drive including at least one print head, and a controller for controlling the movements of the movable drive and the movable substrate. The movable drive is adapted to move the print head back and forth in a second plane and the print head is adapted to deposit a solder bump at the connection sites of the semiconductor die.

The invention further provides a print head adapted to deposit solder bumps having a diameter of less than 100 microns, and preferably 10 or less microns, and a pitch of less than 100 microns, and preferably 10 or less microns. The print head includes pockets of a metallic hydride, preferably titanium hydride, within one or more chambers. The print head further includes a solder reservoir, a solder conduit, a gas conduit and an ejection port. By passing a current through a heating element, the solder in the solder reservoir is melted, allowing it to flow to the ejection port. The metallic hydride pockets are heated to a temperature sufficient to generate hydrogen, which increases the pressure of the hydrogen gas within each chamber and allows ejection of the solder from the ejection port.

These and other advantages and features of the invention will be more readily understood from the following detailed description of the invention which is provided in connection with the accompanying drawings.

DETAILED DESCRIPTION OF PREFERRED EMBODIMENTS

Figure 1:
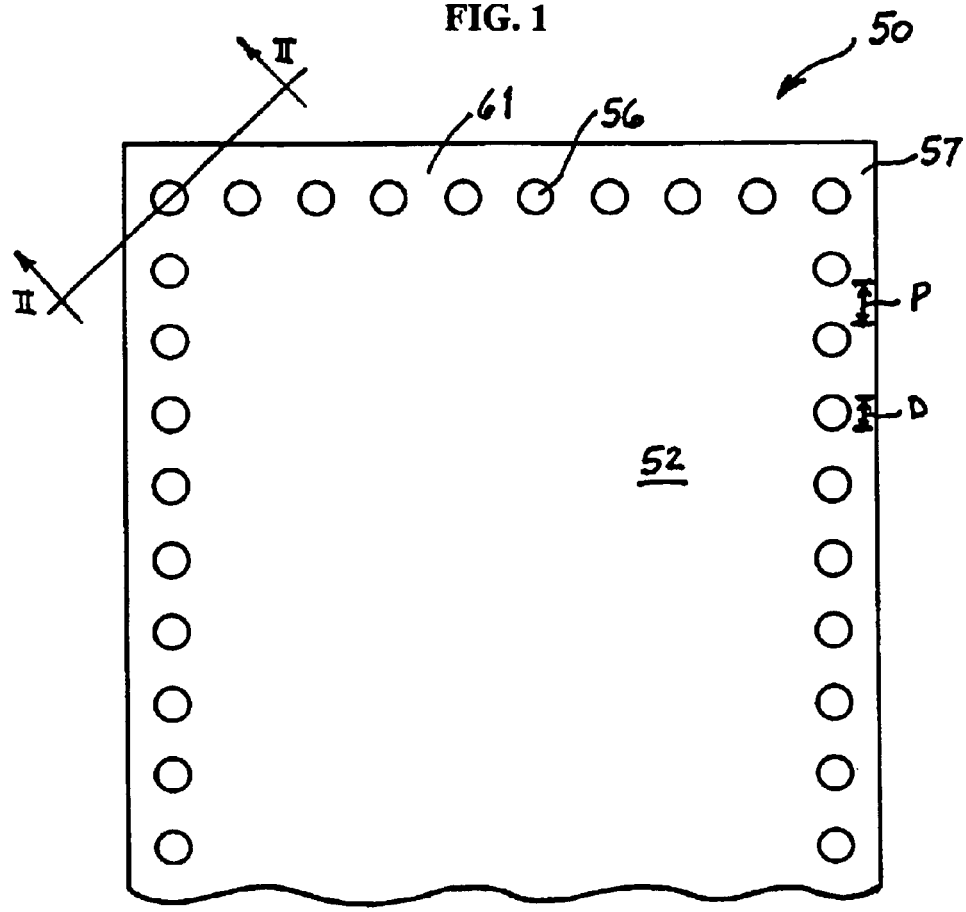
FIG. 1 is a partial top view of a flip chip semiconductor die constructed in accordance with an embodiment of the invention.
Figure 2:
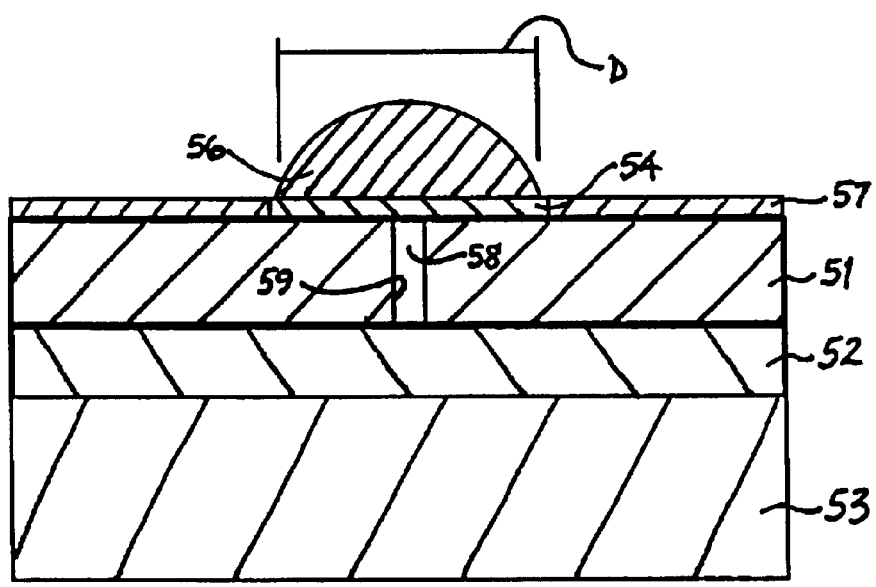
FIG. 2 is a cross-sectional view taken along line II—II of FIG. 1.

FIGS. 1–2 illustrate a flip chip semiconductor die 50 fabricated according to an exemplary embodiment of the invention. The semiconductor die 50 includes a substrate 53 containing fabricated semiconductor devices and features and metallurgy layers, an upper metallurgy layer 52, an insulating layer 51, e.g. an oxide layer, and a passivating layer 57. A plurality of conductive bond pads 54 are located on the insulating layer 51 surrounded by the passivating layer 57. Each bond pad 54 has a corresponding solder bump 56 on a surface thereof, creating a micro C-4 ball array 61. The solder bumps 56 are formed of a solder material which may contain lead or which may be lead-free.

A respective via 58 extends from each bond pad 54 through the oxide layer 51 to the upper metallurgy layer 52. Each via 58 is lined with a conductive material 59, allowing electrical connection between the solder bumps 56 and circuitry on the metallurgy layer 52. Although the illustrated semiconductor die 50 shows the ball array 61 lining the outer edges thereof, it is to be appreciated that the solder bumps 56 may be arrayed in rows and/or columns or in any desired pattern across an entire surface of the insulating layer 51. Also, although the upper layers of the die 50 are shown as having one metallurgy layer 52, it should be understood that the bond pads 54 may be electrically connected through the vias 58 to other metallurgy layers of the die 50 besides the uppermost metallurgy layer 52.

Conventional semiconductor dies include solder bumps 56 having a diameter of 100 microns or more and a pitch between solder bumps of 100 microns or more. The solder bumps 56 of the semiconductor die 50 constructed in accordance with the invention have a diameter D of less than about 100 microns, and preferably as small as about 10 microns or less. Further, the semiconductor die 50 has a pitch P between solder bumps 56 within the same row or column of less than about 100 microns, and preferably about 10 microns or less. Since the diameter D and the pitch P are each about a magnitude smaller than conventional diameters and pitches, the potential density of connection sites, i.e., the solder bumps 56, on the semiconductor die 50 is greater than the density of connection sites on conventional semiconductor dies by about two orders of magnitude.

Figure 3:
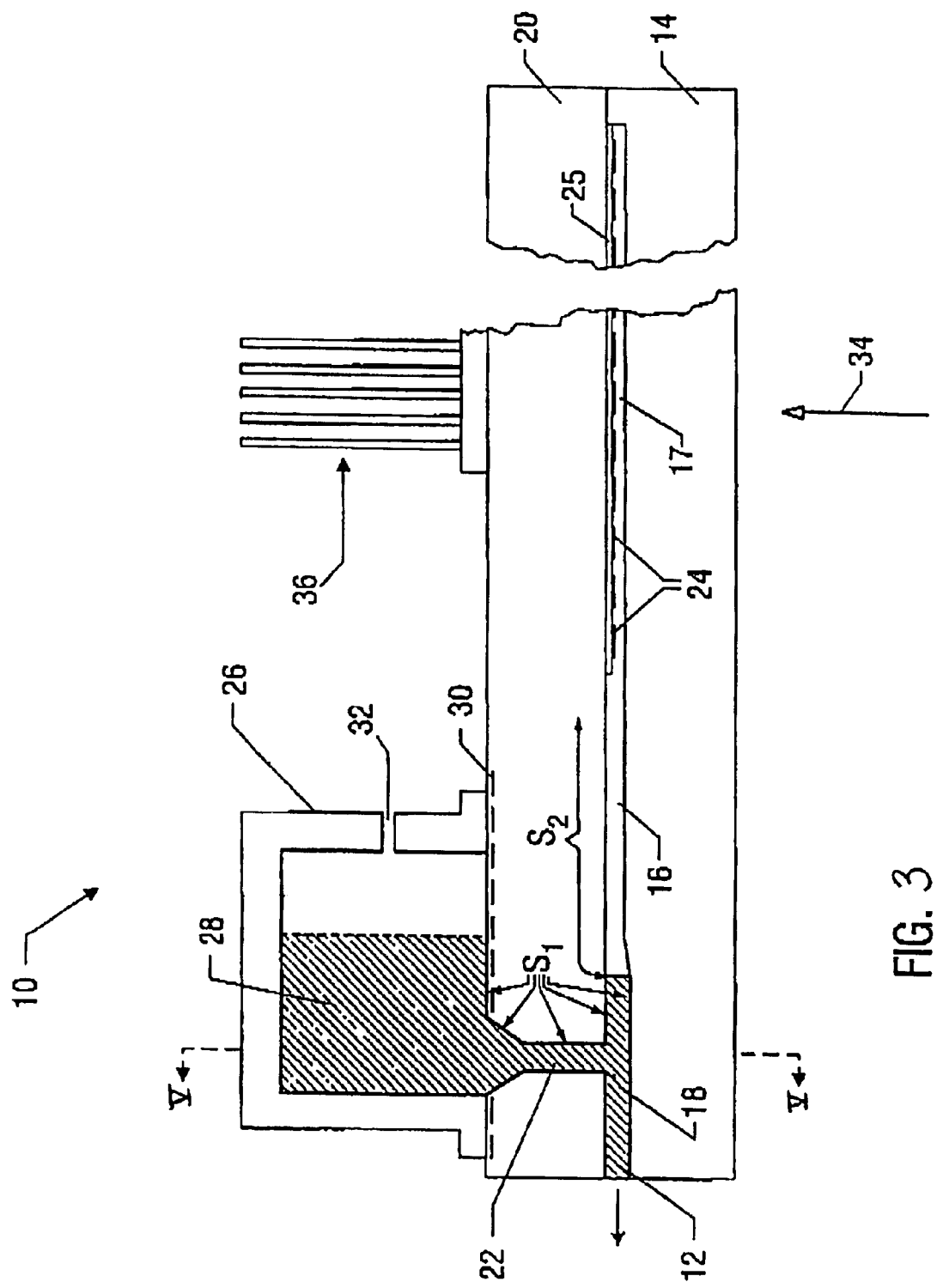
FIG. 3 is a partial cross-sectional view through a channel of a solder-ejecting print head used in forming the semiconductor die of FIG. 1.
Figure 4:
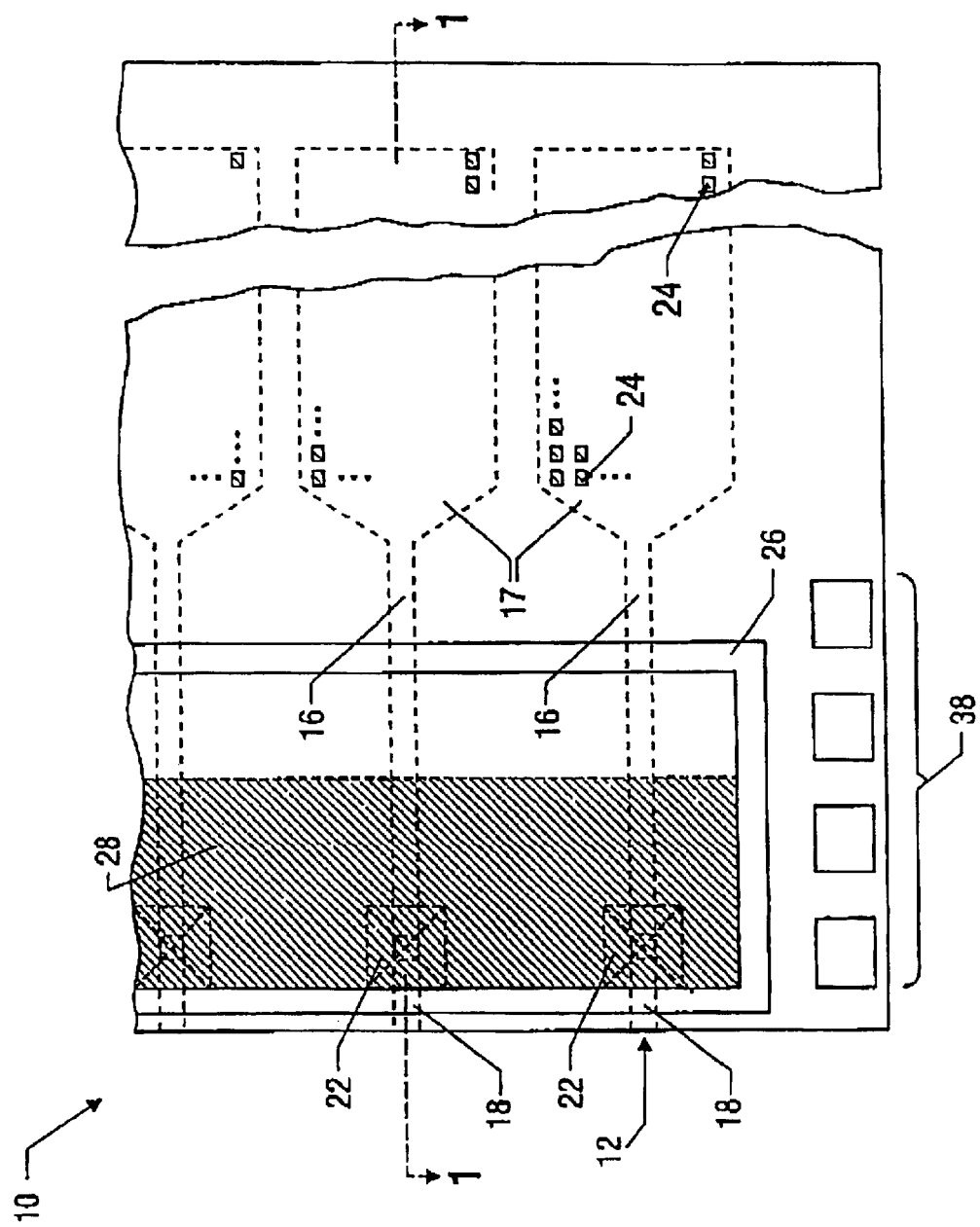
FIG. 4 is a partial top-view perspective of the print head of FIG. 2.
Figure 5:
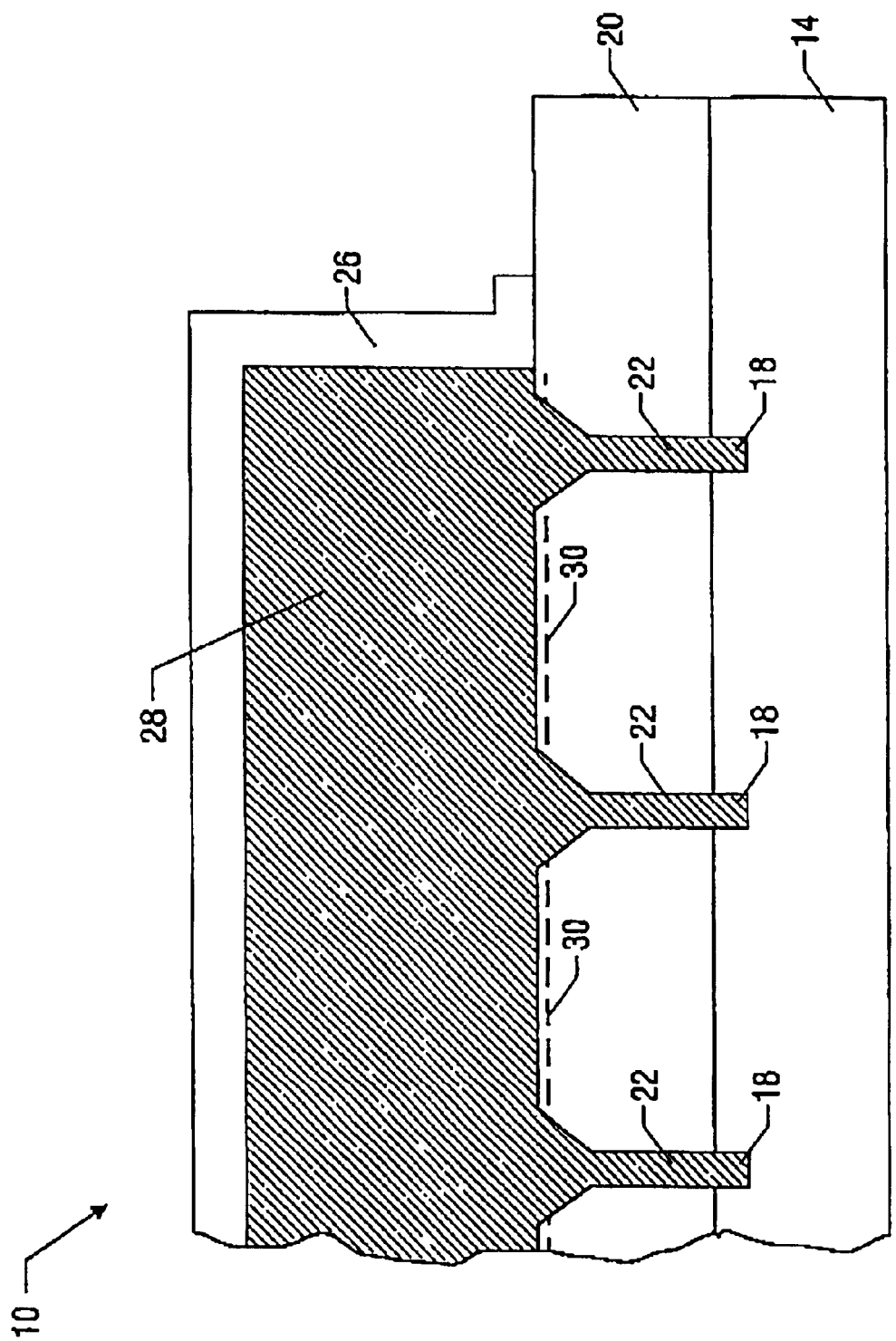
FIG. 5 is a cross-sectional view through the print head taken along line V—V of FIG. 3.

FIGS. 3–5 illustrate a thermal solder jet apparatus capable of depositing the solder bumps 56 on the semiconductor die 50 connection sites with a diameter and/or pitch less than 100 microns. In the illustrated thermal solder jet apparatus, liquid solder is ejected from an array of conduits by a burst of hydrogen gas created by thermally decomposing a metallic compound such as a titanium hydride ($TiH_2$) film.

In the illustrated thermal solder jet apparatus, hydrogen gas pressure bursts are generated by heating small volumes of a metallic compound, such as titanium hydride ($TiH_2$), or other similar materials to their disassociation temperatures (usually on the order of 200 to 800° C.) in a relatively enclosed volume. The temperature at which the hydrogen disassociates from a given film depends on the particular hydride involved. Vanadium hydride begins to decompose at temperatures of around 200° C. while $TiH_2$ begins to decompose at around 500 to 600° C. While the precise hydrogen desorption kinetics depends on such variables as grain size and oxygen content, it is clear that hydrogen evolves virtually spontaneously from $TiH_2$ at temperatures between approximately 600 and 700° C. While $TiH_2$ is preferred as the pressure source in the embodiment of the invention disclosed herein, other metal hydrides, oxides, and nitrides behave similarly and may also be useful.

The thermal solder jet apparatus illustrated in FIGS. 3–5 includes a print head 10. The print head 10 is normally oriented such that a solder ejection port 12 points downward in the direction of gravity during operation; however, FIGS. 3–5 are drawn at 90 degrees from this orientation for clarity. One skilled in the art will recognize that the print head 10 in an actual manufacturing environment would likely be suspended over an integrated circuit (or other appropriate substrate) for ejection of solder (or other appropriate liquid) thereupon. Also, the print head 10 would normally be connected to appropriate drive and control electronics at contact pads 38 (FIG. 4) and to a stepper motor to position the print head 10 to appropriate locations over the integrated circuit. Moreover, an ambient stream of an inert gas or a surrounding vacuum system is ordinarily used to prevent oxidation of the solder during its ejection and to regulate cooling of the solder bumps on the integrated circuit. The vacuum may also be helpful in removing spent hydrogen gas from the thermal solder jet apparatus. However, since these details are known to one of skill and are not necessary for understanding the workings of the thermal solder jet apparatus, only the details of the print head 10, and not its surrounding environment, are discussed in detail.

The print head 10 includes a transparent substrate 14, preferably formed of glass, which has a gas conduit 16 and a solder conduit 18 etched therein. The print head 10 also includes a wafer 20, preferably including silicon, which has a solder feed-through 22 etched therein. The solder feed-through 22 is in fluid connection with the solder conduit 18. The various structures can be formed on the wafer 20 and the substrate 14 by a variety of different well-known processes known in the art of semiconductor fabrication, including the use of wet etching and reactive ion etching. The wafer 20 and the substrate 14 are separately prepared with the appropriate structures and then bonded together, for example, by use of a low melting glass or epoxy, or by Mallory bonding.

Prior to the bonding of the wafer 20 and the substrate 14, a dielectric such as a silicon dioxide layer 25 is formed on the wafer 20. The layer 25 can be either thermally grown or deposited, and may be selectively etched away in unwanted locations if desired. Thereafter, an array of small islands (or a single large film) of titanium is formed on the layer 25 by, for example, titanium sputtering and etching. The titanium islands are then converted to $TiH_2$ islands 24 by exposing the titanium to hydrogen at a temperature of approximately 300 to 500° C. At hydrogen pressures of 0.1 to 1.0 atmospheres, the titanium will be converted into a hydride within a few tenths of seconds to a couple of minutes, depending on the specific hydrogenation conditions and the structural morphology and purity of the titanium. Note that this hydrogenation of the titanium can be accomplished after the wafer 20 is joined to the substrate 14.

The space in which a group of $TiH_2$ islands are found is referred to herein as a chamber 17. Each chamber 17 provides a source of pressure for a single channel in the print head 10, the channel being the combination of a chamber 17, the gas conduit 16, the solder conduit 18, the solder flow-through 22, and a solder ejection port 12, as shown in cross-section in FIG. 3. In an actual commercial embodiment, the print head 10 would likely have several channels (three are shown in FIG. 4) so that a row of solder bumps may be printed at one time.

A solder reservoir 26, which is preferably independently formed of glass, is filled with a sufficient amount of solder 28 to produce a desired number of solder bumps, such as solder bumps 56, on the integrated circuits, such as the semiconductor die 50, served by the print head 10. The solder 28 may contain lead or may be lead-free solder. The solder reservoir 26 may be joined to the wafer 20 in a variety of ways, including the use of a low melting glass or epoxy, or by Mallory bonding. The solder reservoir 26 itself can be formed in several ways. One way is to metallurgically cast the solder 28 into a shape that fits the reservoir 26. This cast can then be placed inside the reservoir 26 before it is joined to the wafer 20. Alternatively, the solder reservoir 26 can have a cover plate (not shown). In this embodiment, the main body of the reservoir 26 may be joined to the wafer 20 and then the solder cast is added. Then, the cover plate is joined to the reservoir main body. This joining process, as one of skill in the art would recognize, depends on the melting temperature of the solder 28 as well as the temperature needed to accomplish the bonding. The solder reservoir 26 also includes a vent hole 32 to equalize the pressure inside of the reservoir after an amount of solder has been ejected from the print head 10.

After connection of the reservoir 26 to the wafer 20 and during operation of the print head 10, a current may be passed through a heating element 30 which is built into or on the wafer 20 between it and the solder reservoir 26. The heating element 30, which is preferably a resistive heating element, when activated provides a heating temperature which exceeds the melting point of the solder 28 in the solder reservoir 26, allowing the solder 28 to flow through the solder feed-through 22 into the solder conduit 18 and out of the solder ejection port 12 when ejected. A suitable resistive heating element 30 can be fabricated in a number of ways, but it is presently preferred to form the heating element 30 as a passivated thin film resistor, or a diffused resistor structure built into the wafer 20. Furthermore, the geometry of the resistive heating element 30 is preferably a single serpentine structure underlying the entire solder reservoir 26, although this is not shown. The two ends of the resistive heating element 30 can be connected to the contact pads 38 (FIG. 4) so that current may be passed therethrough by electronics (not shown) of the print head 10. Additionally, the print head 10 may include additional temperature sensing and control circuitry to optimize the temperature of solder 28.

Prior to the interconnection of the wafer 20, the substrate 14, and the solder reservoir 26, portions of the wafer 20 (including the solder flow-through 22) and the substrate 14 (including the solder conduit 18), and the interior of the solder reservoir 26, are covered by a non-oxidizable metal film. These portions are labeled $S_1$ in FIG. 3. Such metal films are preferably formed at portions $S_1$ by various well-known processes including physical sputtering and chemical vapor deposition of a suitable non-oxidizable metal, such as platinum, rhodium, palladium, gold and perhaps nickel (which forms only about 10 angstroms of tarnishing oxide under clean conditions). The function of the non-oxidizable metal film is to treat those surfaces that will be in contact with the molten solder 28 during operation of the print head 10 so that the solder 28 wets them. Due to surface tension effects, and assisted by gravity, the molten solder 28 will wet only the surfaces covered by the non-oxidizable metal film. In this manner, the solder conduit 18 will be "self-primed" with solder 28 after each ejection event.

The portions $S_2$ not coated with the non-oxidizable metal (including the gas conduit 16) are instead coated with a thermodynamically stable, clean oxide, such as silicon dioxide, aluminum oxide, etc. These portions are not wetted by the molten solder 28. Optionally, the $S_2$ portions may be coated by other materials that control the incursion of other liquids that might be used with this invention. A perfluoroalkoxy copolymer, such as a DuPont Teflon® 340 PFA, is one such example. This polymer has excellent high-temperature properties and the low surface energy characteristic of Teflon®. While not necessary in an application involving the ejection of solder, a material such as Teflon® is necessary when ejecting liquids that wet oxides. In any event, the force of gravity tends to keep solder from flowing upwards by capillary action into the gas conduit 16 and the chamber 17 regardless of the surface treatment of the $S_2$ portions.

During operation of the print head 10, a small-spot (e.g., approximately one square micrometer) laser beam 34 is rastered through the substrate 14 and onto the $TiH_2$ islands 24 to generate hydrogen within the chamber 17. This sudden release of hydrogen creates a suitably high pressure of hydrogen gas within the chamber 17 to eject the solder 28 in the solder conduit 18 out the solder ejection port 12 and onto the integrated circuit below. Cooling fins 36 may be mounted on the top of wafer 20 to screen from the chamber 17 the excessive heat generated by the laser beam 34, thus minimizing the unwanted release of hydrogen from the $TiH_2$ islands 24 that are not struck with the laser beam 34. As an alternative to the laser beam, an array of passivated thin film resistors or diffused resistors could be formed on or in the wafer 20 to rapidly heat the $TiH_2$ islands 24 to their decomposition temperatures. However, in view of the large number of $TiH_2$ islands 24, the electronics to control the heating of each individual island 24 might be unnecessarily complicated when compared with the use of the laser beam 34.

The silicon dioxide layer 25 that underlies the $TiH_2$ islands 24 optimizes heat transfer from the laser 34 to the islands 24. The layer 25 is less thermally conductive than the underlying wafer 20, and thus serves to sharpen the temperature rise experienced by the $TiH_2$ islands 24 during exposure to laser beam 34. In other words, the layer 25 thermally isolates the $TiH_2$ islands 24 from the other components in the system. The thickness of the layer 25 should be thick enough to provide a suitably quick temperature rise to the islands 24, but should also be thin enough to allow heat to diffuse from the islands 24 to the cooling fins 36 during the time period between strikes of the laser 34. Preferably, the thickness of the layer 25 may be between about 50 and about 200 angstroms, as such a thickness would allow for reasonably rapid cooling, which of the two parameters (quick temperature rise and heat diffusion) is the more important. Finite element analysis may be employed to optimize the thickness of layer 25. In addition, the location at which the laser beam 34 strikes the $TiH_2$ islands 24 can vary to optimize the cooling of the chamber 17. For example, the laser beam 34 can be made to strike an island 24 on the right side of the chamber 17, followed by a strike on an island 24 on the left side of the chamber 17, etc.

An example describing several critical parameters is now provided to show the feasibility of printing an array of 80 by 80 solder bumps 56 onto the semiconductor die 50, each bump 56 having a diameter D of 40 microns, and being separated by a pitch of 100 microns. While this example is directed to producing a pitch of about 100 microns, preferably the pitch would be equal to or less than 10 microns. To maximize printing speed, the print head 10 should contain 80 solder ejection ports 12 (and their related structures) separated at a distance of 100 microns from each other to deposit solder bumps 56 at a pitch of 100 microns. Obviously, for a pitch of equal to or less than 10 microns, the solder ejection ports 12 are to be separated at a distance of equal to or less than 10 microns.

A hemispherical solder bump 56 that is 40 microns in diameter D is equivalent to a cylindrical volume which is 40 microns in diameter and 13.3 microns in length. Alternatively, a solder cylinder 53.2 microns in length by 20 microns in diameter yields a solder bump of the same volume. This assumes, of course, that surface tension forces are sufficient during the time of flight to significantly reshape the elongated projectile to a relatively rounded one or alternatively that reshaping would take place mainly on the substrate. Assuming that the solder 28 is predominantly composed of lead, and thus has a density of approximately 10 g/cm$^3$, the mass of the solder bump 56 is approximately $2.67 \times 10^{-8}$ g, or $5.88 \times 10^{-11}$ lbs. Neglecting surface energy effects in the solder conduit 18, the steady-state pressure required to support that mass in a solder conduit 18 that is 40 micrometers in diameter is extremely small, approximately $3.0 \times 10^{-5}$ lbs/in$^2$ or $2.0 \times 10^{-6}$ atmospheres.

To deposit the solder bumps 56 with a pitch P of 100 microns, a reasonably sized chamber 17 is needed. Such a chamber 17 can include a continuous TiH$_2$ film or an array of TiH$_2$ islands 24 as shown in FIG. 4. With a chamber of this size, twenty thousand, TiH$_2$ islands 24 one square micrometer in area can be fabricated for each chamber 17, assuming that the TiH$_2$ film covers only twenty-five percent of the available chamber area for any given channel.

Table 1 below provides estimates of the maximal hydrogen pressures that are achievable for various sizes of chambers 17 and TiH$_2$ islands 24. In making these estimates, it was assumed that all of the hydrogen is released from the indicated TiH$_2$ island. The hydrogen pressure is assumed to rise stepwise in this temporarily closed volume in a time (probably less than several microseconds) that is too short to realize solder ejection from the solder ejection port 12. As one example, a 1 by 1 by 3 cubic micrometer TiH$_2$ island 24 contains approximately $5.39 \times 10^{-9}$ cm$^3$ of hydrogen at 25° C. and one atmosphere. If the space between the cover plate and the top of the TiH$_2$ film is set at one micrometer and the TiH$_2$ film is assumed to be continuous (not patterned into islands), the hydrogen pressure buildup within the space in the 100 by 800 by 1 cubic micrometer ($8 \times 10^{-8}$ cm$^3$) chamber 17 will be approximately 0.07 atmospheres, or one psi. The pressure required to support the mass of a 40 micrometer diameter bump in a 40 micrometer diameter solder conduit 18 was estimated to be only $3.0 \times 10^{-5}$ psi. The force generated by the hydrogen release in this case is therefore over 30,000 times greater than that needed to support the mass of the solder 28. Indeed, in each of the examples provided in Table 1, the estimated hydrogen pressure is at least a few orders of magnitude greater than the estimated pressure needed to support the mass of solder 28, suggesting that the disclosed thermal solder jet apparatus operates as desired to effectuate suitable ejection of the solder 28 out of the solder ejection port 12 to create the solder bumps 56 on the semiconductor die 50.

Unlike the piezoelectric print heads of conventional apparatus, the disclosed embodiments can be made to function at higher temperatures if it is desirable to increase the ejection velocity. The diffusivity of hydrogen in titanium coupled with the relative thinness of the TiH$_2$ sources indicates that the hydrogen can be released in less than a microsecond, provided the hydride temperature can be raised just as rapidly to values on the order of approximately 700 to 800° C. Notwithstanding these physical observations, the fact that the chamber pressure is a few orders of magnitude greater than that necessary to support the solder mass (as discussed in the last paragraph) suggests that the ejection velocity of any of the embodiments disclosed in Table 1 will be sufficient.

It is essential to remove at least part of the hydrogen inside the chamber 17 after the solder 28 is ejected. Otherwise the solder conduit 18 cannot be primed anew with fresh solder 28 via capillary action. Since the capillary forces are quite strong, however, it is probably only necessary to reduce the hydrogen pressure in the chamber 17 to a value that is perhaps one or two orders of magnitude below the maximum ejection pressure. In this regard, estimates were made of the time required for hydrogen removal assuming that the print head 10 was operating in a vacuum ambient. For the purpose of this estimation, the hydrogen outflow through the channel can be treated as a viscous gas flow through a cylindrical tube. Assume that this tube is 40 micrometers in diameter by 80 micrometers in length, the conductance of air is approximately $53 \times 10^{-3}$ CM$^3$/sec through a tube of these dimensions at 25° C., and the conductance of hydrogen is about twice this value. Factoring in such parameters as the average mean free path allows one to determine the time to evacuate a chamber from atmospheric pressure to various smaller values. For the small volume (about $8 \times 10^{-8}$ CM$^3$) of the chamber disclosed, a conductance of about $53 \times 10^{-3}$ CM$^3$/sec is sufficient to lower the pressure in the chamber 17 from $10^6$ to $10^-$microns of mercury in about $6.3 \times 10^{-6}$ seconds. An additional $6.3 \times 10^{-6}$ seconds will lower the pressure by yet another order of magnitude.

Thus, it is estimated that the solder conduit 18 will be refilled with solder 28 in perhaps 10 to 20 microseconds. This is an improvement over thermal ink jet print heads of the same dimension, which take less than a millisecond to refill. However, if it is conservatively assumed that the disclosed embodiment will take one millisecond to refill, any given channel in the disclosed print head 10 could operate at an ejection rate of about $10^3$ Hz. Thus, it would take about 80 milliseconds to print an integrated circuit with an array of 80 by 80 solder bumps. Since the number of TiH$_2$ islands 24 in each channel can vary from roughly 10,000 to 40,000, a print head built in accordance with the disclosed embodiment should be able to print between 125 to 500 integrated circuits.

TABLE 1

ESTIMATED CHAMBER PRESSURES FOR VARIOUS GEOMETRIES

| Chamber | | Chamber Free Vol. | | TiH$_2$ | Releasable H$_2$ | Chamber Press. | |
|---|---|---|---|---|---|---|---|
| Area | Ht. | (cm$^3$) | Area | Ht. | Volume (cm$^3$) | atm | psi |
| 100 × 800 | 1 | 8 × 10$^{-8}$ | 1 | 3 | 5.46 × 10$^{-9}$ | 0.068 | 1.0 |
| 100 × 800 | 5 | 40 × 10$^{-8}$ | 1 | 3 | 5.46 × 10$^{-9}$ | 0.014 | 0.2 |
| 100 × 400 | 1 | 4 × 10$^{-8}$ | 2 | 5 | 1.82 × 10$^{-8}$ | 0.46 | 6.70 |
| 100 × 100 | 5 | 5 × 10$^{-8}$ | 9 | 10 | 1.64 × 10$^{-7}$ | 3.3 | 48.2 |
| 100 × 10$^3$ | 10 | 1 × 10$^{-8}$ | 9 | 10 | 1.64 × 10$^{-7}$ | 0.16 | 2.4 |

The Chamber and TiH$_2$ heights are in micrometers, while the H$_2$ volumes are at standard temperature and pressure, or 60° F. and 14.7 psia. The Chamber height refers to the distance between the top of the hydride and the cover plate.

Figure 6:
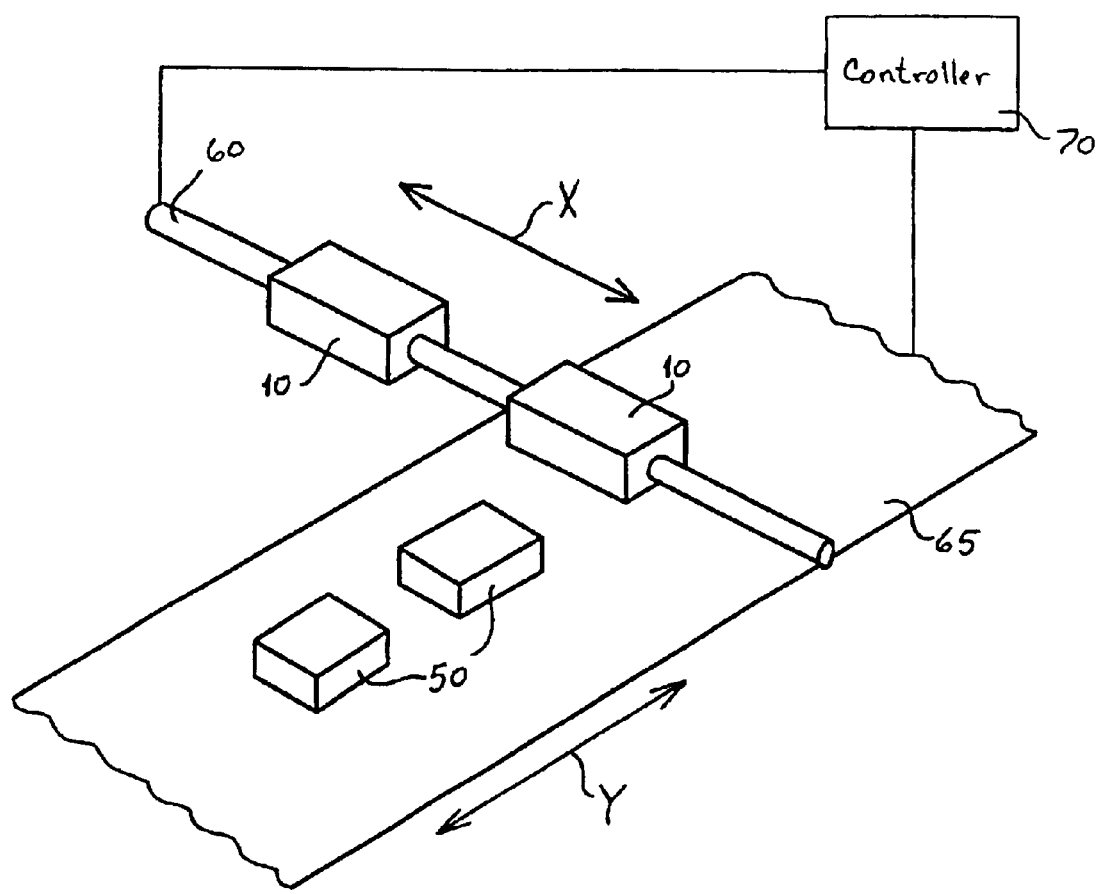
FIG. 6 is a perspective view of a thermal solder jet system in accordance with an embodiment of the invention.

FIG. 6 illustrates a system for depositing the solder bumps 56 on a plurality of semiconductor dies 50. As shown in FIG. 6, a plurality of print heads 10 may be mounted on a movable drive, such as a rotating shaft 60, to allow movement of the print heads 10 in a direction X. Additionally, semiconductor dies 50 may be positioned upon a movable substrate 65 so that they may be moved in a direction Y underneath the print heads 10. Both the shaft 60 and the movable substrate 65 are connected with a controller 70 which controls and choreographs the movements of the dies 50 and the print heads 10 in order to accurately deposit solder bumps 56 on the dies 50. By linking multiple print heads 10 together, several steps can be done serially at each bond pad 54. For example, a first print head 10 may be filled with a cleaning agent, and during its pass over the dies 50 it ejects small drops of the cleaning agent to remove unwanted tarnishing surface oxides. A second print head 10 may include adhesive metal or alloy, which it ejects on each of the bond pads 54. A third print head 10, which includes the bumping metallurgy, such as the solder 28, ejects the solder 28 on the bond pads 54 to create the solder bumps 56. Alternatively, if larger connection sites are desired, multiple passes of the third print head 10 can increase the size of the solder bumps 56. And finally, a fourth print head 10 may include a passivation material which is suitable to prevent or retard the growth of tarnishing oxides which may grow during storage of the dies 50.

Instead of having each linked print head 10 depositing different materials, any number of or all of the linked print heads 10 may deposit the same material. Further, successive print heads 10 may each deposit a single element which, when combined with the other deposited elements, forms the solder bumps 56.

Furthermore, the controller 70 may control the actions of the movable substrate 65 and the shaft 60 such that the placement of solder bumps 56 may be personalized from die 50 to die 50 and across a single die 50. Additionally, since the thermal solder jet apparatus may be operated under a curtain of inert gas, deposition of the solder bumps 56 may be accomplished at a lower cost, since a vacuum system is not required. Also, the thermal solder jet apparatus is relatively inexpensive and is relatively highly reliable, both factors of which will further lessen production costs.

Figure 7:
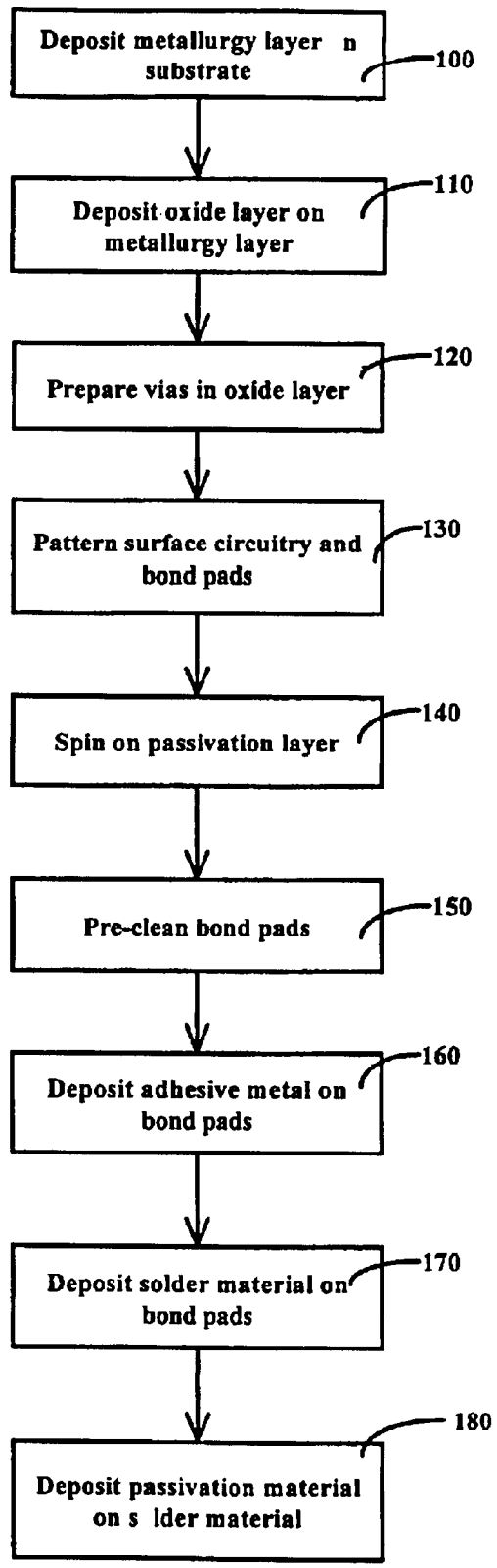
FIG. 7 is a flow diagram of the steps involved in fabricating a semiconductor die in accordance with an embodiment of the invention.
Figure 8:
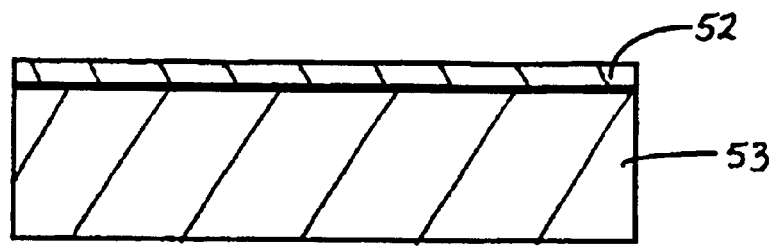
FIGS. 8–13 illustrate various stages of a semiconductor die being constructed in accordance with an embodiment of the invention.
Figure 9:
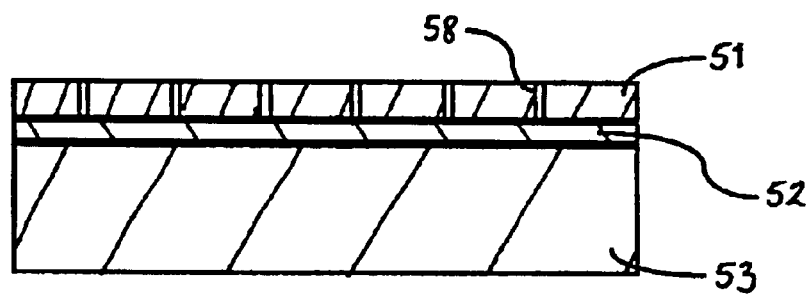
Figure 10:
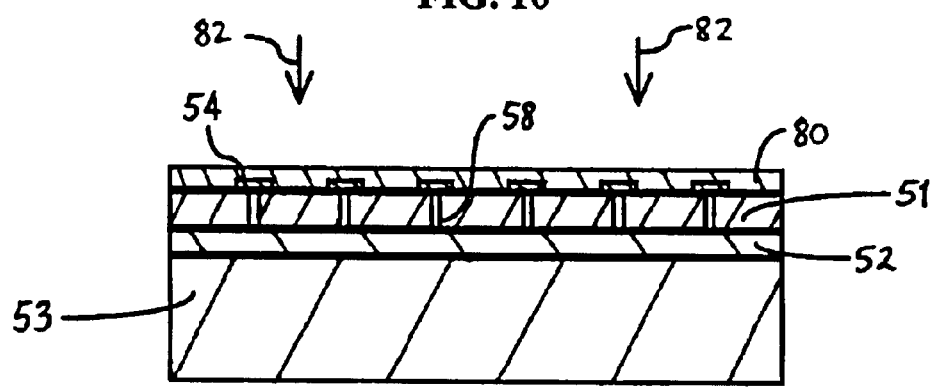
Figure 11:
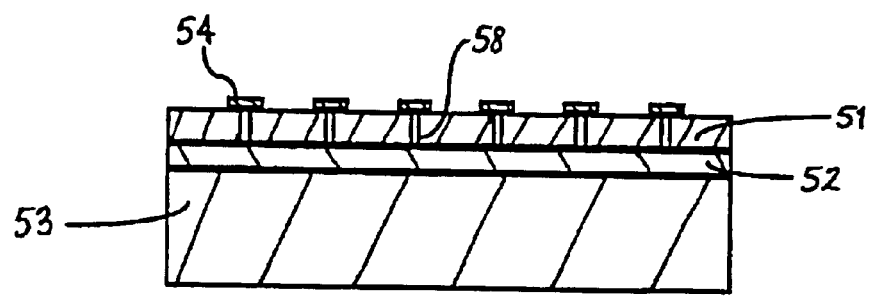
Figure 12:
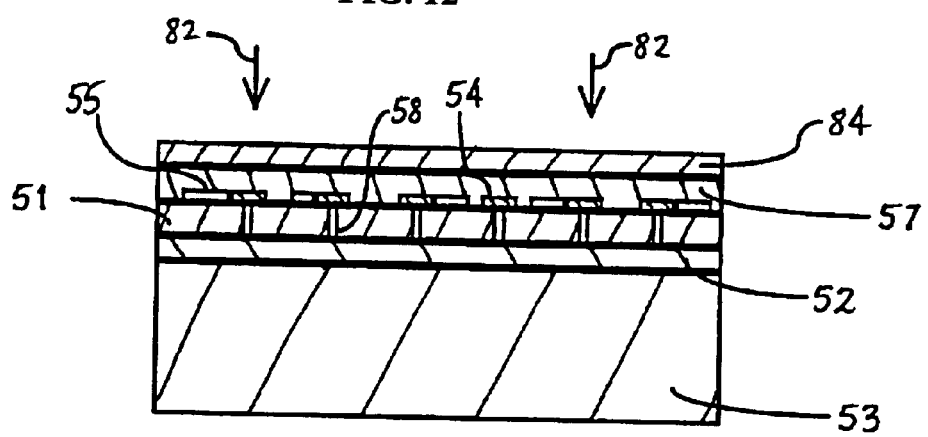
Figure 13:
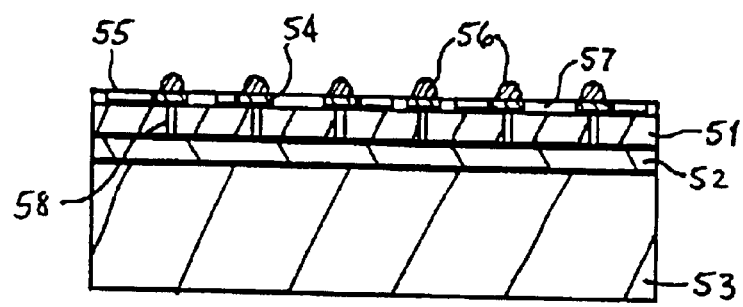

A method of producing a semiconductor die 50 having an array of solder bumps 56 will next be described with reference to FIGS. 7–13. The process begins with the fabrication of the uppermost metallurgy layer 52 of the die 50. At step 100, the metallurgy layer 52 including circuitry is deposited on the substrate 53 (FIGS. 7–8). An oxide layer 51 is then deposited on the metallurgy layer 52 at step 110 (FIGS. 7, 9). In a preferred embodiment, the oxide layer 51 is chemical vapor deposited on the metallurgy layer 52 and then planerized through chemical mechanical polishing. The vias 58 are then etched in the oxide layer 51 at step 120. Preferably, a resist layer is deposited over the oxide layer and a via hole pattern is developed in the resist layer, allowing accurate etching of the vias 58. At step 130, the bond pads 54 and any surface circuitry are patterned and deposited (FIGS. 7, 10–11). Preferably, a resist layer 80 is deposited on the oxide layer 51 and patterns for the surface circuitry and the bond pads 54 are exposed. The resist is patterned to expose the surface circuitry, leaving resist where no metal is desired. Then, metal is deposited in the pattern. In a preferred embodiment, the metal deposited in a pattern within the oxide layer 51 includes a metallurgical stack of 500 angstroms of zirconium, followed by 750 angstroms of nickel, 5,000 angstroms of copper, and 750 angstroms of gold. This level of metallurgy provides both a last wiring level and is the pad limiting metallurgy. Any unwanted metal may be lifted off using a tape liftoff. The remaining resist layer 80 is removed. Then, at step 140 a polymer material 57, preferably a polyimide, is spun on the oxide layer 51 and over the bond pads 54 and cured (FIGS. 7, 12). The polyimide serves as a passivation layer, or an insulator. This is followed with the deposition of a photoresist material 84 which is imaged at the bond pads 54. The photoresist material 84 is developed and the image is transferred through the photoresist material 84 and the polyimide material 57 using appropriate RIE processes. Then the photoresist material 84 is stripped.

After printing the bond pad pattern, at step 150 the bond pads 54 are pre-cleaned (FIG. 7). Specifically, a print head 10 which is filled with a cleaning agent passes over the dies 50 and ejects small drops of the cleaning agent to remove unwanted tarnishing surface oxides. Then, if required, at step 160 an adhesive metal is deposited on the bond pads 54. For example, if solder 28 formed of a lead-tin composition is deposited on bond pads 54 formed of gold, no adhesive material would be required. This may be accomplished by passing another print head 10 having the adhesive metal or alloy over the bond pads 54. Then, yet another print head 10, which includes the bumping metallurgy, such as the solder 28, is passed over the bond pads 54 at step 170, ejecting the solder 28 on the bond pads 54 to create the solder bumps 56. Finally, a fourth print head 10 may be passed over the dies 50 to eject a passivation material onto the solder bumps 56 at step 180. The passivation material prevents or retards the growth of tarnishing oxides which may grow during storage of the dies 50. After step 180, the dies 50 which are still part of a wafer can be diced and flipped onto an appropriate substrate.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while a thermal solder jet apparatus is described as being used to produce the flip chip semiconductor dies of the invention, it should be appreciated that the invention is not limited to being produced by such an apparatus. Accordingly, the invention is not to be seen as limited by the foregoing description, but is only limited by the scope of the appended claims.

What is claimed as new and desired to be protected by Letters Patent of the United States is:

1. A flip chip semiconductor die, comprising:
    a plurality of exterior bond pads formed on said die; and
    a plurality of solder bumps deposited on said bond pads, wherein each said solder bump is less than about 100 microns in diameter and wherein at least some of said solder bumps are spaced by a pitch of less than about 100 microns.

2. The semiconductor die of claim 1, wherein said solder bumps are about 10 microns or less in diameter.

3. The semiconductor die of claim 1, wherein said pitch is about 10 microns or less.

4. The semiconductor die of claim 1, wherein said solder bumps are attached to each said bond pad with an adhesive metal.

5. A semiconductor device, comprising:

a substrate;

a die having a metallurgy layer positioned over said substrate;

an oxide layer deposited over said metallurgy layer; and a plurality of connection sites coupled to said metallurgy layer through said oxide layer, wherein a solder bump deposited on each said connection site is less than about 100 microns in diameter and wherein at least some of said solder bumps are spaced by a pitch of less than about 100 microns.

6. The packaged semiconductor device of claim 5, wherein said solder bumps are about 10 microns or less in diameter.

7. The packaged semiconductor device of claim 5, wherein said pitch is about 10 microns or less.

8. The packaged semiconductor device of claim 5, wherein said solder bumps are attached to each said connection sites with an adhesive metal.

9. The packaged semiconductor device of claim 5, wherein said die has more than one metallurgy layer positioned over said substrate.

10. A flip chip semiconductor die, comprising:

a plurality of exterior bond pads formed on said die; and a plurality of solder bumps deposited on said bond pads, wherein each said solder bump is about 10 microns or less in diameter and wherein at least some of said solder bumps are spaced by a pitch of about 10 microns or less.

11. A semiconductor device, comprising:

a substrate;

a die having a metallurgy layer positioned over said substrate;

an oxide layer deposited over said metallurgy layer; and a plurality of connection sites coupled to said metallurgy layer through said oxide layer, wherein a solder bump deposited on each said connection site is less than about 10 microns in diameter and wherein at least some of said solder bumps are spaced by a pitch of less than about 10 microns.

* * * * *